United States Patent [19]

Larson et al.

[11] 4,420,663
[45] Dec. 13, 1983

[54] MATERIAL FOR ELECTRICAL DEVICES HAVING A FLEXIBLE MEMBER

[75] Inventors: Willis A. Larson, Crystal Lake; Edwina K. Dulen, Fox Lake, both of Ill.

[73] Assignee: Oak Industries Inc., Rancho Bernardo, Calif.

[21] Appl. No.: 213,948

[22] Filed: Dec. 8, 1980

[51] Int. Cl.³ .......................... H01H 3/12; H01H 9/24
[52] U.S. Cl. ............................... 200/159 B; 200/5 A
[58] Field of Search ............. 200/159 B, 5 A; 361/24, 361/283

[56] References Cited

U.S. PATENT DOCUMENTS

| Re. 28,365 | 3/1975 | Braue | 200/159 B |
|---|---|---|---|
| 3,290,439 | 12/1966 | Wilcox et al. | 200/5 A |
| 3,857,073 | 12/1974 | Yagitani | 361/324 |
| 4,197,439 | 4/1980 | Meckelburg et al. | 200/159 B |
| 4,243,852 | 1/1981 | Larson | 200/159 B |
| 4,258,096 | 3/1981 | La Marche | 200/159 B |
| 4,263,485 | 4/1981 | Corwin | 200/159 B |

*Primary Examiner*—Willis Little
*Attorney, Agent, or Firm*—Kinzer, Plyer, Dorn & McEachran

[57] ABSTRACT

This invention relates to flexible materials for use in electrical devices, such as membrane switches. The flexible component of the device is formed of paper.

7 Claims, 3 Drawing Figures

MATERIAL FOR ELECTRICAL DEVICES HAVING A FLEXIBLE MEMBER

SUMMARY OF THE INVENTION

This is concerned with materials for use in electrical devices. The material is specifically contemplated for use in membrane switches as the membrane layer, however, the invention is not to be limited to this application.

An object of the present invention is an improved flexible material for use in an electrical device.

Another object is a material for electrical devices which is relatively inexpensive.

Another object is a material for electrical devices which has high strength to resist tearing yet is flexible enough to perform its intended function.

Another object is a material for electrical devices to which conductive materials, such as inks and the like, will readily adhere.

Another object is a material for electrical devices which is a good electrical insulator.

Still another object is a material which is opaque so that various indicia or graphics may be created without a separate opaquing operation.

A further object is a material which readily accepts the inks associated with the graphics used on switches.

These and other objects are attained by use of a paper material for the flexible component of an electrical device.

DESCRIPTION OF A PREFERRED EMBODIMENT

Figure 1:
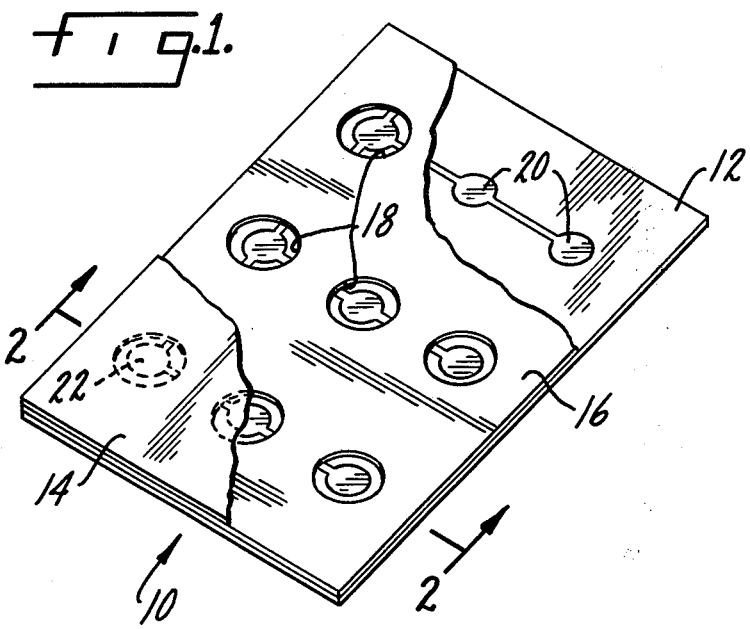
FIG. 1 is a perspective view of a membrane switch, with portions cut away.
Figure 2:
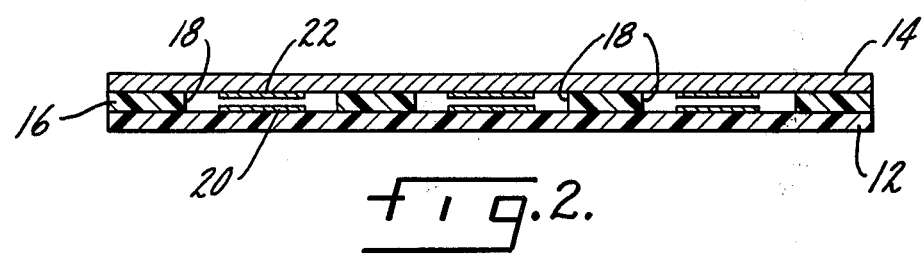
FIG. 2 is a section taken generally along line 2—2 of FIG. 1.

This invention is concerned with materials for use in electrical devices. It is specifically directed to a material for use as the membrane layer in a membrane switch. Looking at FIGS. 1 and 2, a typical membrane switch is shown generally at 10. The switch includes a substrate 12 which may be either rigid or flexible. A flexible membrane 14 overlies the substrate. Intervening between the membrane 14 and substrate 12 is an insulative spacer 16. The spacer has a plurality of openings 18 through which conductors may move to actuate a switch.

The substrate 12 has a pattern of electrical conductors 20 formed on its upper surface. Similarly, the membrane 14 has a pattern of conductors 22 on its lower surface. Each conductor pattern has a plurality of switch sites, shown here in the form of contact pads. These are aligned with an opening 18 in the spacer 16. The spacer normally holds the conductors 20 and 22 in spaced, non-contacting relation. When the upper surface of the membrane is subjected to pressure at one of the switch sites, the membrane flexes, allowing a contact pad to move through a spacer opening 18 and into electrical contact with the conductor pattern 20 of the substrate. When the pressure is released the membrane returns to its initial position. It will be understood that the switch shown is for illustrative purposes only and the arrangement of parts could be other than that shown.

According to the present invention, the membrane 14 is made of paper. Paper has been found to be a superior material in membrane switch applications where switch life, i.e., the number of switch cycles, is not a concern. It is cheaper than currently-used materials and is very durable. This makes it an excellent material for use in electronic toys and games. In addition to ordinary bond paper, special grades of paper have been found acceptable. One such grade is sold by Kimberly-Clark Corporation under the trademark "Kimdura". These special grades have a variety of characteristics that make them particularly adaptable for use in membrane switches. "Kimdura", for example, has high strength that makes it tear resistant.

The membrane switch may have a paper membrane while other materials are used for the substrate and spacer. Or the substrate and spacer could also be made of paper, possibly in a unitary, folded configuration.

Figure 3:
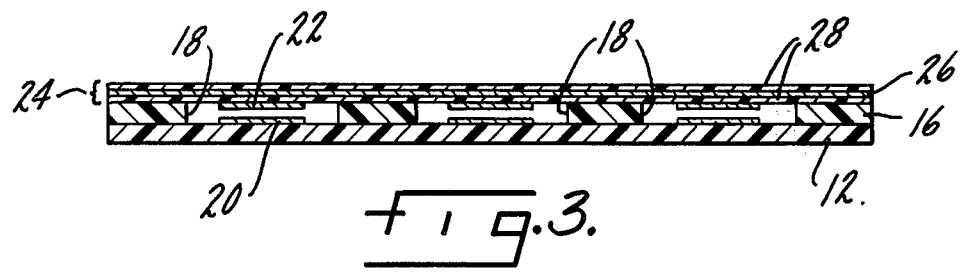
FIG. 3 is a view similar to FIG. 2, with a modified membrane structure.

FIG. 3 shows an alternate embodiment of the invention. The substrate 12 and spacer 16 are the same as described above but the membrane 24 has a laminated paper construction. This may typically include a paper layer 26 at the center with a thin layer of polyester 28 on either side of the paper. The paper layer 26 may be on the order of 5 mils thick and the polyester film 28 may be about 1 mil thick. The polyester is held in place by a suitable adhesive.

An advantage of the paper membrane material is it is relatively inexpensive compared to other materials. Another advantage is the ease with which graphics can be applied. The paper membrane allows use of all the inks normally used on paper. This greatly expands the variety of graphics that can be created because the inks do not have to adhere to plastic materials as they have in the past. In the case of the paper-polyester laminate, the graphics can be applied to the paper before the polyester is applied. The polyester then forms a protective coating for the graphics.

The invention also contemplates using paper in electrical devices other than membrane switches. For example, membrane potentiometers and rotary switches are now being made. Paper can be used in these as well as in the membrane switch shown. Therefore, the invention is not to be limited to the specific showing. Rather, the changes and alterations apparent to those skilled in the art are to be deemed within the scope of the following claims.

We claim:

1. An electrical switch having a flexible component made of paper said flexible component having electrical conductive areas printed thereon.

2. The structure of claim 1 wherein the switch is a membrane type switch and the flexible component is the membrane.

3. The structure of claim 1 further characterized in that the paper flexible component is laminated with a layer of polyester film on at least one side of the paper.

4. The structure of claim 3 wherein the substrate is formed of paper.

5. The structure of claim 3 wherein the spacer is formed of paper.

6. A membrane switch of the type having a flexible membrane, a substrate, facing patterns of conductors printed on the membrane and substrate respectively, and an insulative spacer disposed between the conductor patterns to normally hold them in non-contacting relation, the spacer having openings therein such that aligned portions of the conductor patterns may contact each other in response to pressure on the membrane whereby the membrane is moved through a spacer opening to contact the substrate, the improvement comprising a membrane made of flexible paper.

7. The structure of claim 6 where the paper membrane is laminated with a layer of polyester on at least one side of the paper.

* * * * *